(12) United States Patent
Streibl et al.

(10) Patent No.: US 8,125,812 B2
(45) Date of Patent: Feb. 28, 2012

(54) METHOD AND DEVICE FOR TRANSMITTING OUTGOING USEFUL SIGNALS AND AN OUTGOING CLOCK SIGNAL

(75) Inventors: Martin Streibl, Petershausen (DE); Peter Gregorius, Munich (DE); Ralf Schledz, Zolling (DE)

(73) Assignee: Qimonda AG, Munich (DE)

( * ) Notice: Subject to any disclaimer, the term of this patent is extended or adjusted under 35 U.S.C. 154(b) by 848 days.

(21) Appl. No.: 12/058,899

(22) Filed: Mar. 31, 2008

(65) Prior Publication Data

US 2008/0240290 A1 Oct. 2, 2008

(30) Foreign Application Priority Data

Mar. 31, 2007 (DE) .......................... 10 2007 015 643

(51) Int. Cl.
*G11C 5/02* (2006.01)
(52) U.S. Cl. ...................... 365/51; 365/189.09; 375/299
(58) Field of Classification Search .................. 365/51, 365/189.09, 203, 207, 189.11, 191, 194, 365/230.03, 230.06; 375/299, 355, 340
See application file for complete search history.

(56) References Cited

U.S. PATENT DOCUMENTS

| | | | |
|---|---|---|---|
| 4,549,290 A * | 10/1985 | Bell | 370/283 |
| 5,883,926 A | 3/1999 | Fitzgerald et al. | |
| 7,650,526 B2 * | 1/2010 | Alon et al. | 713/503 |
| 2005/0146911 A1 * | 7/2005 | Kuenemund | 365/63 |
| 2006/0066373 A1 | 3/2006 | Yang | |
| 2006/0221761 A1 * | 10/2006 | Wallner et al. | 365/233 |

OTHER PUBLICATIONS

R. Ose, "Elektrotechnik fuer Ingenieure: Bauelemente und Grundschaltungen mit PSPICE (Broschiert)", Hanser Fachbuchverlag, Auflage: 1 (Nov. 2, 2006) S. pp. 75-79.
B. Wong et al., "Nano-CMOS Circuit and Physical Design", Wiley Interscience, Nov. 29, 2004, Ch. 4, pp. 135-171.
"Common-mode Backchannel Signaling System for Differential High-speed Links", Andrew Ho, et al., Rambus, Inc., Los Altos, CA, Department of Electrical Engineering, Stanford University, CA.
"Crosstalk Limitations in Phantom Signal Transmission", Xavier Aragones, et al., IEEE Workshop, May 13-16, 2011.

* cited by examiner

*Primary Examiner* — Dang Nguyen
(74) *Attorney, Agent, or Firm* — Dicke, Billig & Czaja, PLLC

(57) ABSTRACT

Method and device for transmitting outgoing useful signals and an outgoing clock signal. Useful signals and a clock signal are transmitted from a transmitter via a first line pair and a second line pair to a receiver. A first useful signal is transmitted in the form of a modulated difference between the electrical potentials of the first line pair. A second useful signal is transmitted in the form of a modulated difference between the electrical potentials of the second line pair. The clock signal is transmitted in the form of a modulated difference between the average value of the potentials of the first line pair and the average value of the potentials of the second line pair.

25 Claims, 9 Drawing Sheets

METHOD AND DEVICE FOR TRANSMITTING OUTGOING USEFUL SIGNALS AND AN OUTGOING CLOCK SIGNAL

CROSS-REFERENCE TO RELATED APPLICATIONS

This Utility Patent Application claims priority to German Patent Application No. DE 10 2007 015 643.1-55 filed on Mar. 31, 2007, which is incorporated herein by reference.

BACKGROUND

The present invention relates to a method for transmitting outgoing useful signals and an outgoing clock signal from a transmitter via at least two line pairs to a receiver, and to a method for receiving incoming useful signals and an incoming clock signal from a transmitter via at least two line pairs, and to a transmitter and a receiver.

Outgoing useful signals representing digital information are transmitted for example between a memory controller and a memory component, between memory components and between other integrated circuits. The data rates used in this case are being increased further and further in accordance with the general trend in information technology. The data rate is determined, on the one hand, by the number of parallel lines between a transmitter and a receiver and, on the other hand, by the bit rate or bandwidth of the transmission on each individual line. In order that information represented in outgoing useful signals can be reliably recovered at the receiver end, an outgoing clock signal is typically transmitted at the same time. At the transmitter there is a well-defined phase relationship between the outgoing clock signal and the outgoing useful signals. At the receiver end, a clock is obtained from the outgoing clock signal and with application of an adjustable phase difference, the outgoing useful signals being sampled using the clock.

A number of parallel lines via which the outgoing useful signals are transmitted are conventionally provided for example between a memory controller and a memory component. The outgoing useful signals represent data, addresses or control commands, by way of example. In addition, one or a plurality of clock signal lines via which the outgoing clock signals are transmitted are provided. When a single clock signal line is used for a multiplicity of useful signal lines, the centrally received outgoing clock signal or the clock obtained therefrom must be distributed to all the receivers connected to the useful signal lines. Transmission of a respective outgoing clock signal for a small group (for example two or four) of useful signal lines results in an undesirable increase in the total number of lines and pins or contacts at the transmitter and at the receiver.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
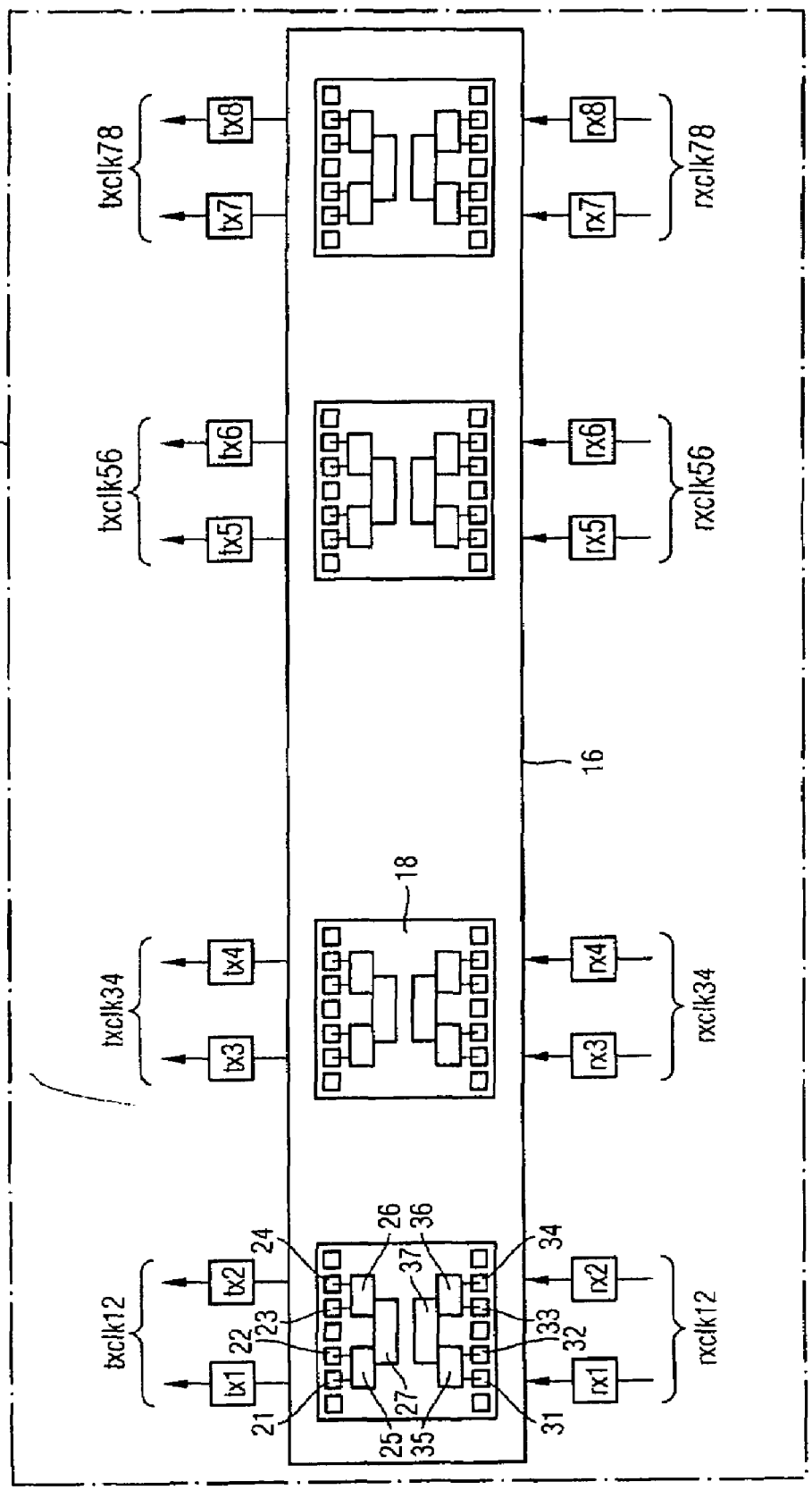
FIG. 1 illustrates a schematic illustration of an integrated circuit.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the following description, numerous specific details are set forth. However, it is understood that embodiments may be practiced without these specific details. In other instances, well-known circuits, structures and techniques have not been illustrated in detail in order not to obscure the understanding of this description.

One embodiment provides a method for transmitting useful signals and a clock signal from a transmitter via a first line pair and a second line pair to a receiver. A first useful signal is transmitted in the form of a modulated difference between the electrical potentials of the first line pair. A second useful signal is transmitted in the form of a modulated difference between the electrical potentials of the second line pair. The clock signal is transmitted in the form of a modulated difference between the average value of the potentials of the first line pair and the average value of the potentials of the second line pair. one or more embodiments provide improved methods for transmitting and respectively receiving outgoing useful signals and an outgoing clock signal, and also an improved transmitter and an improved receiver.

One embodiment provides a method for receiving useful signals and a clock signal from a transmitter via a first line pair and a second line pair. A first useful signal is received in the form of a modulated difference between the electrical potentials of the first line pair. A second useful signal is received in the form of a modulated difference between the electrical potentials of the second line pair. The clock signal is received in the form of a modulated difference between the average value of the potentials of the first line pair and the average value of the potentials of the second line pair. A clock is determined from the clock signal.

One embodiment provides a transmitter for transmitting information and clock via at least two line pairs to a receiver. The transmitter includes a first output driver, which is connected to a first pair of outputs for the connection of a first line pair, for modulating the difference between the potentials of the first line pair, which represents a first information item, a second output driver, which is connected to a second pair of outputs for the connection of a second line pair, for modulating the difference between the potentials of the second line pair, which represents a second information item, and a clock driver, which is connected to the first pair of outputs and the second output driver, for modulating the difference between the average value of the potentials of the first line pair and the average value of the potentials of the second line pair, which represents the clock.

One embodiment provides a receiver for receiving information and a clock via at least two line pairs from a transmitter. The receiver includes a first receiver circuit, which is connected to a first pair of inputs for the connection of a first line pair, for detecting the modulated difference between the potentials of the first line pair, which represents a first information item, a second receiver circuit, which is connected to a second pair of inputs for the connection of a second line pair, for detecting the modulated difference between the potentials of the second line pair, which represents a second information item, and a third receiver circuit, which is connected to the first and the second pair of inputs, for detecting the modulated difference between the average value of the potentials of the first line pair and the average value of the potentials of the second line pair, which represents the clock.

FIG. 1 is a schematic illustration of one embodiment of an integrated circuit 12, for example, of a memory component, a memory controller or a processor. The integrated circuit 12 has one or a plurality of input and output units 18 in a region 16. The region 16 is for example strip-shaped and arranged for example in a central region of the integrated circuit 12 or of the semiconductor chip of the integrated circuit 12. The integrated circuit 12 receives and/or transmits information, for example in the case of a memory component data, addresses and control commands, via the input and output units 18.

Each input and output unit 18 includes a plurality of inputs 21, 22, 23, 24 and a plurality of outputs 31, 32, 33, 34, which are formed in FIG. 1 by way of example as bonding pads or connecting contact areas for contact-connection by bonding wires. Alongside the outputs 21, 22, 23, 24 and inputs 31, 32, 33, 34 described below, each input and output unit 18 can have any desired number of further inputs and outputs. By way of example, FIG. 1 illustrates in each case six further inputs or outputs at each input and output unit.

A first output 21 and a second output 22 are connected to a first output driver 25, and a third output 23 and a fourth output 24 are connected to a second output driver 26. A clock driver 27 is connected to the outputs 21, 22, 23, 24, via the output drivers 25, 26 in the example illustrated.

A first input 31 and a second input 32 are connected to a first receiver circuit 35, and a third input 33 and a fourth input 34 are connected to a second receiver circuit 36. A third receiver circuit 37 is connected to the inputs 31, 32, 33, 34 via the first receiver circuit 35 and the second receiver circuit 36 in the example illustrated in FIG. 1.

The first output driver 25 is designed to transmit via the first output 21 and the second output 22 a first outgoing useful signal tx1 in the form of a modulated difference between the electrical potentials of the first output 21 and of the second output 22 and of a first line pair connected to them. The second output driver 26 is designed to transmit via the third output 23 and the fourth output 24 a second outgoing useful signal tx2 in the form of a modulated difference between the electrical potentials of the third output 23 and of the fourth output 24 and of a second line pair connected to the latter. The clock driver 27 is designed to transmit simultaneously via the same outputs 21, 22, 23, 24 an outgoing clock signal txclk12 in the form of a modulated difference between the average value of the potentials of the first output 21 and of the second output 22 and the average value of the potentials of the third output 23 and of the fourth output 24.

In one embodiment, each outgoing useful signal tx1, tx2 is transmitted as a differential mode signal of a line pair and the outgoing clock signal txclk12 is transmitted as a difference between the common mode signals of the two line pairs.

The outgoing clock signal txclk12 represents a clock. The first outgoing useful signal tx1 represents a first information item, and the second outgoing useful signal tx2 represents a second information item. The clock, the first information item and the second information item are provided for example by the receiver circuits 35, 36, 37 or by other functional units illustrated in FIG. 1. The first output driver 25 generates the first outgoing useful signal tx1 in a manner controlled by the clock and the first information item. The second output driver 26 generates the second outgoing useful signal tx2 in a manner controlled by the clock and the second information item. The clock driver 27 generates the outgoing clock signal txclk12 in a manner controlled by the clock.

The first receiver circuit 35 receives, via the first input 31 and the second input 32, a first incoming useful signal rx1 in the form of a modulated difference between the potentials of the first input 31 and of the second input 32 or of a line pair connected thereto. The second receiver circuit 36 receives, via the third input 33 and the fourth input 34, a second incoming useful signal rx2 in the form of a modulated difference between the electrical potentials of the third input 33 and of the fourth input 34 or of a line pair connected thereto. The third receiver circuit 37 receives, via the inputs 31, 32, 33, 34 an incoming clock signal rxclk12 in the form of a modulated difference between the average value of the potentials of the first connection 31 and of the second connection 32 and the average value of the potentials of the third connection 33 and of the fourth connection 34.

In one embodiment, each incoming useful signal rx1, rx2 is transmitted as a differential mode signal of a line pair and the incoming clock signal rxclk12 is transmitted as a difference between the common mode signals of the two line pairs.

The incoming clock signal rxclk12 represents a clock used for sampling the incoming useful signals rx1, rx2. The incoming clock can furthermore be used as an outgoing clock for the generation of the outgoing clock signal txclk12. Furthermore, the incoming clock can be used as a clock for further circuits of the integrated circuit 12.

In one variant of the integrated circuit 12 illustrated in FIG. 1, the first receiver circuit 35 samples the first useful signal rx1 in a manner controlled by the clock represented by the incoming clock signal rxclk12, in order to obtain first information represented by the first useful signal. Correspondingly, in the case of this variant, the second receiver circuit 36 samples the second useful signal rx2 in a manner controlled by the clock represented by the incoming clock signal rxclk12, in order to obtain second information represented by the second useful signal rx2.

The first information item represented by the first incoming signal rx1 and the second information item represented by the second incoming signal rx2 are forwarded to functional units (not illustrated in FIG. 1) of the integrated circuit 12 in order for example to be processed or stored there. As an alternative, the first information item and the second information item, as explained above, are output in the form of the first outgoing useful signal tx1 and the second outgoing useful signal tx2.

The integrated circuit 12 is both receiver and transmitter. The above explanation relates to a communication in respectively only one direction via each input 21, 22, 23, 24 or output 31, 32, 33, 34. In a departure from this, the inputs and outputs 21, 22, 23, 24, 31, 32, 33, 34 can also be formed in each case for a communication in both directions. Each input is then simultaneously an output and each output is simultaneously an input.

Figure 2:
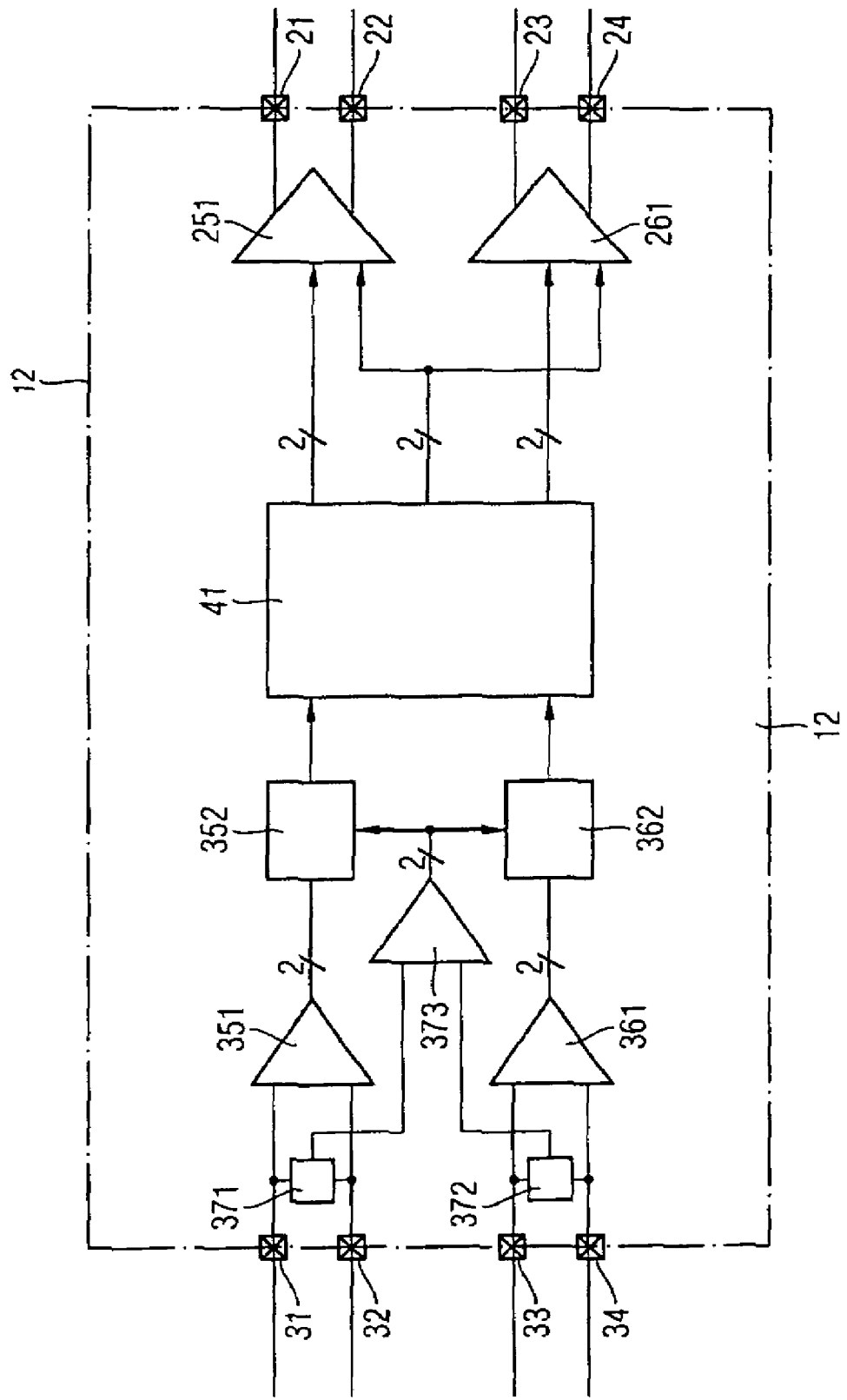
FIG. 2 illustrates a schematic illustration of an integrated circuit.
Figure 3:
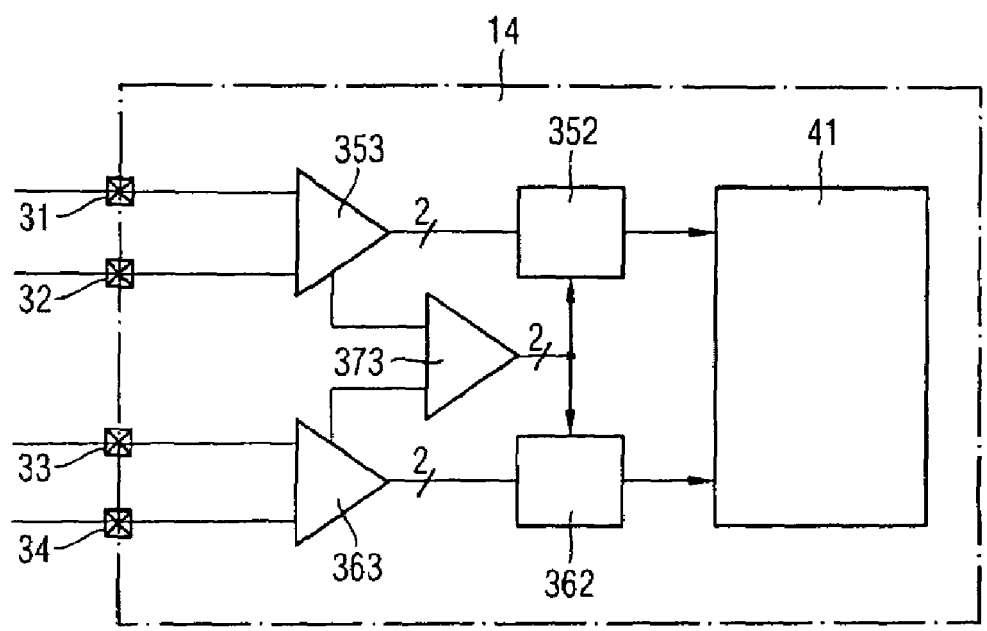
FIG. 3 illustrates a schematic illustration of an integrated circuit.
Figure 4:
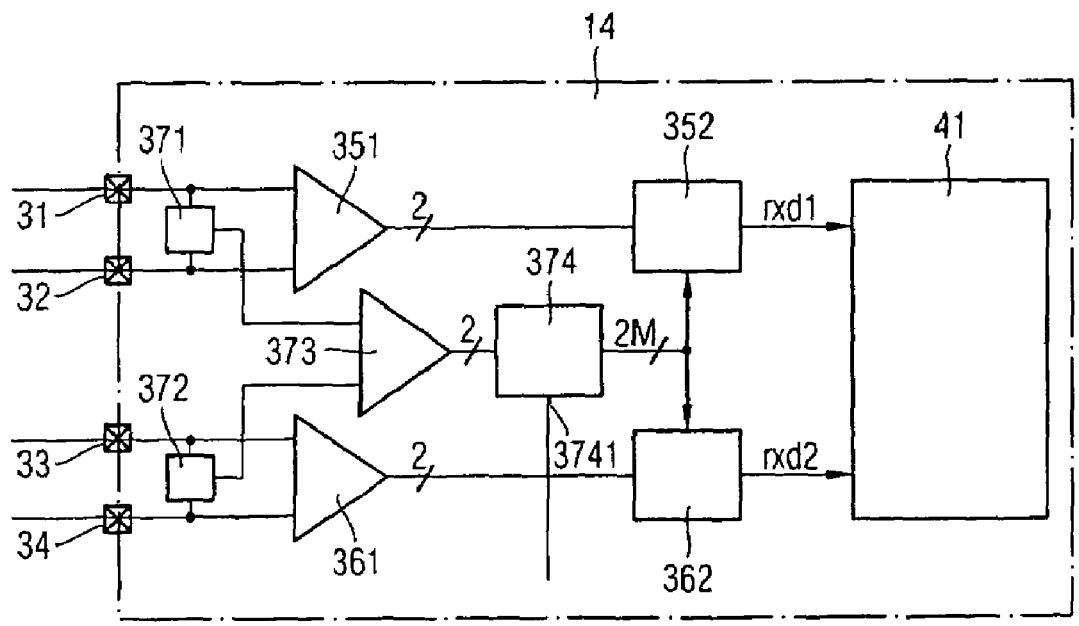
FIG. 4 illustrates a schematic illustration of an integrated circuit.

FIGS. 2 to 4 illustrate schematic illustrations of variants of the integrated circuit 12 explained above with reference to FIG. 1. Only one input and/or output unit is illustrated in each case. The integrated circuits 12 illustrated in FIGS. 2 to 4 have inputs 31, 32, 33, 34, and the integrated circuit illustrated in FIG. 2 furthermore has outputs 21, 22, 23, 24. The integrated circuits 12 illustrated in FIGS. 3 and 4 can also have outputs in a manner similar to the circuits illustrated in FIGS. 1 and 2, but the outputs are not illustrated in FIGS. 3 and 4.

The integrated circuit 12 illustrated in FIG. 2 has a first differential amplifier 351 and a first sampling device 352, which together form a first receiver circuit. Furthermore, the integrated circuit 12 has a second differential amplifier 361 and a second sampling device 362, which together form a second receiver circuit. Inputs of the first differential amplifier 351 are connected to a first input 31 and a second input 32 of the integrated circuit 12. Inputs of the second differential amplifier 361 are connected to the third input 33 and the fourth input 34 of the integrated circuit 12. An output of the first differential amplifier 351 is connected to an input of the first sampling device 352. An output of the second differential amplifier 361 is connected to an input of the second sampling device 362.

The first input 31 and the second input 32 of the integrated circuit 12 are furthermore connected to inputs of a first common mode detector or of a first averaging device 371. The third input 33 and the fourth input 34 of the integrated circuit 12 are furthermore connected to inputs of a second common mode detector or of a second averaging device 372. An output of the first averaging device 371 and an output of the second averaging device 372 are connected to inputs of a third differential amplifier 373. An output of the third differential amplifier 373 is connected to a clock input of the first sampling device 352 and a clock input of the second sampling device 362.

Outputs of a first output driver 251 are connected to a first output 21 and a second output 22 of the integrated circuit 12. Outputs of a second output driver 261 are connected to a third output 23 and a fourth output 24 of the integrated circuit 12.

A first input of a functional circuit 41 is connected to an output of the first sampling device 352, and a second input of the functional circuit 41 is connected to an output of the second sampling device 362. A first output of the functional circuit 41 is connected to a first input of the first output driver 251, and a second output of the functional circuit is connected to a first input of the second output driver 261. A clock signal output of the functional circuit 41 is connected to a second input of the first output driver 251 and a second input of the second output driver 261.

The functional circuit 41 includes for example an array of DRAM, SRAM, CBRAM, PCRAM, MRAM or other volatile or nonvolatile memory cells. As an alternative or in addition, the functional circuit 41 includes a memory controller, a processor or other circuits.

The integrated circuit 12 receives via the first input 31 and the second input 32 a first incoming useful signal in the form of a modulated difference between the electrical potentials of the first input 31 and of the second input 32. Furthermore, the integrated circuit 12 receives via the third input 33 and the fourth input 34 a second incoming useful signal in the form of a difference between the electrical potentials of the third input 33 and of the fourth input 34. Furthermore, the integrated circuit 12 receives via the inputs 31, 32, 33, 34 an incoming clock signal in the form of a modulated difference between the average value of the potentials of the first input 31 and of the second input 32 and the average value of the potentials of the third input 33 and of the fourth input 34.

The first differential amplifier 351 amplifies the difference between the potentials of the first input 31 and of the second input 32 and generates a corresponding differential signal, which is transmitted to the first sampling device 352. The second differential amplifier 361 amplifies the difference between the potentials of the third input 33 and of the fourth input 34 and generates a corresponding differential signal, which is transmitted to the second sampling device 362. The first averaging device 371 forms an average value of the potentials of the first input 31 and of the second input 32, which is transmitted to a first input of the third differential amplifier 373. The second averaging device 372 forms an average value of the potentials of the third input 33 and of the fourth input 34, which is transmitted to a second input of the third differential amplifier 373. The third differential amplifier 373 amplifies the difference between the average values and generates an internal clock signal, which is transmitted to the clock signal inputs of the first sampling device 352 and of the second sampling device 362.

The first sampling device 352 samples the signal received from the first differential amplifier 351 in a manner controlled by the internal clock signal generated by the third differential amplifier 373 or by the clock represented by the internal clock signal, in order to obtain a first incoming information item represented by the first incoming useful signal. The second sampling device 362 samples the signal received from the second differential amplifier 361 in a manner controlled by the internal clock signal generated by the third differential amplifier 373 or the clock represented by the internal clock signal, in order to obtain a second incoming information item represented by the second incoming useful signal. The first incoming information item and the second incoming information item are transmitted to the functional circuit 41.

The first incoming information item and the second incoming information item are stored or processed by the functional circuit 41 or, as described below, output via the output drivers 251, 261 and the outputs 21, 22, 23, 24.

In a departure from the illustration in FIG. 2, the incoming clock signal generated by the third differential amplifier 373 or the clock represented by the incoming clock signal can furthermore be transmitted to the functional circuit 41. In this case, the incoming clock can control the functional circuit 41 and/or be forwarded from the functional circuit 41 to the output drivers 251, 261 or be used for generating the outgoing clock described below.

A first outgoing information item or a signal representing the latter is transmitted from the functional circuit 41 to the first output driver 251. A second outgoing information item or a signal representing the latter is transmitted from the functional circuit 41 to the second output driver 261. Furthermore, an outgoing clock or a signal representing the latter is transmitted from the functional circuit 41 to both output drivers 251, 261.

The first output driver 251 generates a first outgoing useful signal in the form of a modulated difference between the electrical potentials of the first output 21 and of the second output 22 in a manner controlled by the first outgoing information item and the outgoing clock. The first outgoing useful signal represents the first outgoing information item. The second output driver 261 generates a second outgoing useful signal in the form of a modulated difference between the electrical potentials of the third output 23 and of the fourth output 24 in a manner controlled by the second outgoing information item and the outgoing clock. The second outgoing useful signal represents the second outgoing information item. The first output driver 251 and the second output driver 261 jointly generate an outgoing clock signal in the form of a modulated difference between the average value of the potentials of the first output 21 and of the second output 22 and the average value of the potentials of the third output 23 and of the fourth output 24 in a manner controlled by the outgoing clock, the outgoing clock signal representing the outgoing clock.

FIG. 3 is a schematic illustration of one embodiment of an integrated circuit 14 having inputs 31, 32, 33, 34. A first input of a first input amplifier 353 is connected to a first input 31 of the integrated circuit 14. A second input of the first input amplifier 353 is connected to the second input 32 of the integrated circuit 14. A first output of the first input amplifier 353 is connected to an input of a first sampling device 352. An output of the first sampling device 352 is connected to a first input of a functional circuit 41.

A first input of a second input amplifier 363 is connected to a third input 33 of the integrated circuit 14. A second input of the second input amplifier 363 is connected to a fourth input 34 of the integrated circuit 14. A first output of the second input amplifier 363 is connected to an input of a second sampling device 362. An output of the second sampling device 362 is connected to a second input of the functional circuit 41.

A second output of the first input amplifier 353 is connected to a first input of a differential amplifier 373. A second output of the second input amplifier 363 is connected to a second input of the differential amplifier 373. An output of the differential amplifier 373 is connected to a clock input of the first sampling device 352 and to a clock input of the second sampling device 362.

The integrated circuit 14 receives via its inputs 31, 32, 33, 34 a clock signal in the form of a modulated difference between the average value of the potentials of the first input 31 and of the second input 32 and the average value of the potentials of the third input 33 and of the fourth input 34. The first input amplifier 353 generates a first average value signal, which represents the average value of the electrical potentials of the first input 31 and of the second input 32. The first average value signal is transmitted from the first input amplifier 353 via its second output to the first input of the differential amplifier 373. The second input amplifier 363 generates a second average value signal, which represents the average value of the electrical potentials of the third input 33 and of the fourth input 34. The second average value signal is transmitted from the second input amplifier 363 via its second output to the second input of the differential amplifier 373.

The differential amplifier 373 generates an internal clock signal from the difference between the average value signals, the internal clock signal being transmitted via its output to the clock inputs of the sampling devices 352, 362.

The integrated circuit 14 furthermore receives a first useful signal in the form of a modulated difference between the electrical potentials of the first input 31 and of the second input 32. The first input amplifier 353 generates a first differential signal from the modulated difference between the electrical potentials of the first input 31 and of the second input 32. The first differential signal is transmitted via the first output of the first input amplifier 353 to the first sampling device 352. The first sampling device 352 samples the first differential signal in a manner controlled by the internal clock signal or the clock represented by the internal clock signal, in order to obtain a first information item represented by the first useful signal and the first differential signal. The first information item is transmitted to the functional circuit 41.

Furthermore, the integrated circuit 14 receives a second useful signal in the form of a modulated difference between the electrical potentials of the third input 33 and of the fourth input 34. The second input amplifier 363 generates a second differential signal from the difference between the electrical potentials of the third input 33 and of the fourth input 34. The second differential signal is transmitted via the first output of the second input amplifier 363 to the second sampling device 362. The second sampling device 362 samples the second differential signal in a manner controlled by the internal clock signal received from the differential amplifier 373 or the clock represented by the internal clock signal, in order to obtain second information represented by the second useful signal and the second differential signal. The second sampling device 362 transmits the second information item to the functional circuit 41.

FIG. 4 is a schematic illustration of one embodiment of an integrated circuit 14 having inputs 31, 32, 33, 34. A first input of a first differential amplifier 351 is connected to a first input 31 of the integrated circuit 14. A second input of the first differential amplifier 351 is connected to a second input 32 of the integrated circuit 14. An output of the first differential amplifier 351 is connected to an input of a first sampling device 352. An output of the first sampling device 352 is connected to a first input of a functional circuit 41.

A first input of a second differential amplifier 361 is connected to a third input 33 of the integrated circuit 14. A second input of the second differential amplifier 361 is connected to a fourth input 34 of the integrated circuit 14. An output of the second differential amplifier 361 is connected to an input of a second sampling device 362. An output of the second sampling device 362 is connected to a second input of the functional circuit 41.

A first input of a first common mode detector or of a first averaging device 371 is connected to the first input 31 of the integrated circuit 14. A second input of the first averaging device 371 is connected to the second input 32 of the integrated circuit 14. A first input of a second common mode detector or a second averaging device 372 is connected to a third input 33 of the integrated circuit 14. A second input of the second averaging device 372 is connected to a fourth input 34 of the integrated circuit 14. An output of the first averaging device 371 is connected to a first input of a third differential amplifier 373. An output of the second averaging device 372 is connected to a second input of the third differential amplifier 373. An output of the third differential amplifier 373 is connected to an input of a clock conditioning device 374. An output of the clock conditioning device 374 is connected to a clock input of the first sampling device 352 and to a clock input of the second sampling device 362.

The clock conditioning device 374 is for example a CSU (CSU=clock synchronization unit) with a PLL (PLL=phase-locked loop) or a DLL (DLL=delay-locked loop). The clock conditioning device 374 generates a conditioned, in one embodiment stabilized, clock signal having the same clock frequency or a clock frequency increased by a factor M. The clock conditioning device 374 has a control input 3741, via which a phase difference or delay generated by the clock conditioning device 374 can be set by a device that is not illustrated in FIG. 4.

The integrated circuit 14 receives a clock signal in the form of a modulated difference between the average value of the electrical potentials of the first input 31 and of the second input 32 and the average value of the electrical potentials of the third input 33 and of the fourth input 34. The first averaging device 371 generates a first average value signal, which represents the average value of the potentials of the first input 31 and of the second input 32. The first average value signal is transmitted from the first averaging device 371 to the first input of the third differential amplifier 373. The second averaging device 372 generates a second average value signal, which represents the average value of the potentials of the third input 33 and of the fourth input 34. The second average value signal is transmitted from the second averaging device 372 to the second input of the third differential amplifier 373. The third differential amplifier 373 generates a signal, which is transmitted to the clock conditioning device 374, from the difference between the first average value signal and the second average value signal. The clock conditioning device 374 generates from this, by applying a phase difference or delay that can be set via the control input 3741, an internal clock signal having the same frequency or a frequency increased by the factor M. The internal clock signal is transmitted to the sampling devices 352, 362.

The integrated circuit 14 furthermore receives a first useful signal in the form of a modulated difference between the potentials of the first input 31 and of the second input 32. The first differential amplifier 351 amplifies the difference and transmits it in the form of a first differential signal to the first sampling device 352. The first sampling device 352 samples the first differential signal in a manner controlled by the internal clock signal, in order to obtain first information represented by the first useful signal or the first differential signal. The first information item is transmitted to the first input of the functional circuit 41.

Furthermore, the integrated circuit 14 receives a second useful signal in the form of a modulated difference between the potentials of the third input 33 and of the fourth input 34. The second differential amplifier 361 amplifies the difference and transmits it as a second differential signal to the second sampling device 362. The second sampling device 362 samples the second differential signal in a manner controlled by the internal clock signal, in order to obtain second information represented by the second useful signal or the second differential signal. The second sampling device 362 transmits the second information item to the second input of the functional circuit 41.

A clock multiplication by a factor M>1 by the clock conditioning device 374 can bring about a corresponding oversampling of the useful signals or of the signals corresponding thereto by the sampling devices 352, 362. From an evaluation of the information obtained by the oversampling, an item of information about the optimum phase angles or delay for the sampling (in the center of the data eyes) can be obtained and used for setting the phase difference or delay via the control input 3741.

Figure 5:
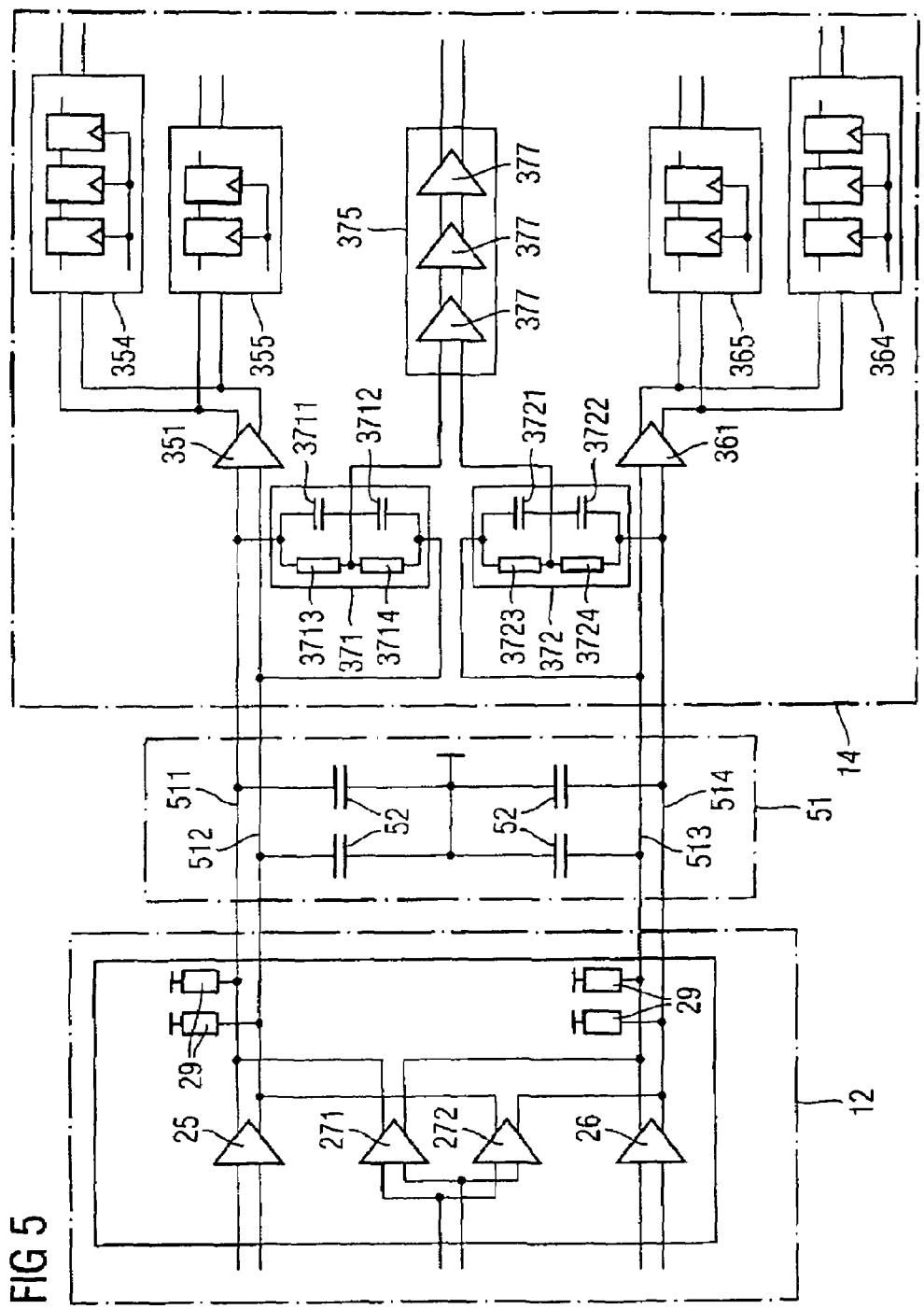
FIG. 5 illustrates a schematic illustration of two integrated circuits coupled to one another.

FIG. 5 is a schematic illustration of a first integrated circuit 12 and of a second integrated circuit 14, which are connected to one another via a signal path 51. The signal path 51 includes a first line 511 and a second line 512 of a first line pair and a first line 513 and a second line 514 of a second line pair. Capacitances or capacitors 52 with respect to ground which are illustrated in FIG. 5 schematically represent capacitive couplings of the lines 511, 512, 513, 514 among one another and to ground or some other reference potential. The capacitors 52 together with the output resistors of the output drivers described below simulate the low-pass filter behavior of the transmission channel in the form of an RC element.

The first integrated circuit 12 includes a first output driver 25 and a second output driver 26, the inputs of which are connected to circuits that are not illustrated in FIG. 5. A first output of the first output driver 25 is connected to the first line 511 of the first line pair. A second output of the first output driver 25 is connected to the second line 523 of the first line pair. A first output of the second output driver 26 is connected to the first line 513 of the second line pair. A second output of the second output driver 26 is connected to the second line 514 of the second line pair. Resistors 29 between the outputs of the output drivers 25, 26 and ground serve for setting the impedances and/or represent parasitic resistances.

Furthermore, the first integrated circuit 12 includes a first clock driver 271 and a second clock driver 272, the inputs of which are connected to circuits that are not illustrated in FIG. 5. In this case, a first input of the first clock driver 271 and a first input of the second clock driver 272 are connected in parallel and a second input of the first clock driver 271 and a second input of the second clock driver 272 are connected in parallel. The clock drivers 271, 272 are differential amplifiers, for example.

A first output of the first clock driver 271 is connected to the first line 511 of the first line pair. A second output of the first clock driver 271 is connected to the first line 513 of the second line pair. A first output of the second clock driver 272 is connected to the second line 512 of the first line pair. A second output of the second clock driver 272 is connected to the second line 14 of the second line pair.

The second integrated circuit 14 includes a first differential amplifier 351 and a second differential amplifier 361. A first input of the first differential amplifier 351 is connected to the first line 511 of the first line pair. A second input of the first differential amplifier 351 is connected to the second line 512 of the first line pair. Outputs of the first differential amplifier 351 are connected in parallel both to inputs of a first sampling device 354 and to inputs of a second sampling device 355. A first input of the second differential amplifier 361 is connected to the first line 513 of the second line pair. A second input of the second differential amplifier 361 is connected to the second line 514 of the second line pair. Outputs of the second differential amplifier 361 are connected in parallel both to inputs of a third sampling device 364 and to inputs of a fourth sampling device 365.

A first input of a first common mode detector or of a first averaging device 371 is connected to the first line 511 of the first line pair. A second input of the first averaging device 371 is connected to the second line 512 of the first line pair. An output of the first averaging device 371 is connected to a first input of a clock conditioning device 375. A first input of a second common mode detector or of a second averaging device 372 is connected to the first line 513 of the second line pair. A second input of the second averaging device 372 is connected to the second line 514 of the second line pair. An output of the second averaging device 372 is connected to a second input of the clock conditioning device 375.

The averaging devices 371, 372 are illustrated in FIG. 5 by way of example respectively with two capacitors 3711, 3712, 3721, 3722 and two resistors 3713, 3714, 3723, 3724. In this case, a parallel connection of a capacitor 3711, 3721 and a resistor 3713, 3723 is respectively connected between the first input and the output of the averaging device 371, 372. A parallel connection of a capacitor 3712, 3722 and a resistor 3714, 3724 is respectively connected between the second input and the output of the averaging device 371, 372. All the capacitors 3711, 3712, 3721, 3722 of the averaging devices 371, 372 have essentially the same capacitance. However, the averaging devices 371, 372 can also have a different internal construction than is illustrated in FIG. 5.

The clock conditioning device 375 is illustrated in FIG. 5 by way of example as a series circuit of a plurality of amplifiers 377. This series circuit generates a delay of a signal passing through the clock conditioning device 375, which delay is predetermined by the properties of the amplifiers 377 and their number. As an alternative, the clock conditioning device 375 has for example a DLL or a PLL.

Circuits of the first integrated circuit 12 that are not illustrated in FIG. 5 generate a clock which is transmitted in the form of a first internal clock signal to the inputs of the clock drivers 271, 272. Furthermore, circuits that are likewise not illustrated in FIG. 5 generate a first information item, which is transmitted in the form of a signal to the inputs of the first output driver 25, and a second information item, which is transmitted in the form of a further signal to the inputs of the second output driver 26. The first output driver generates a first useful signal in the form of a modulated difference between the electrical potentials of the first line 511 and of the second line 512 of the first line pair, which first useful signal represents the first information item. The first output driver 25 preferably generates the first useful signal in a manner controlled by the first internal clock. The second output driver 26 generates a second useful signal in the form of a modulated difference between the electrical potentials of the lines 513, 514 of the second line pair. The second output driver preferably generates the second useful signal in a manner controlled by the first internal clock. Furthermore, the clock drivers 271, 272 generate, in a manner controlled by the internal clock, a clock signal on the lines 511, 512, 513, 514 of the two line pairs of the signal path 51 in the form of a modulated difference between the average value of the potentials of the first line pair 511, 512, and the average value of the potentials of the second line pair 513, 514. The clock signal represents the first internal clock.

The first useful signal, the second useful signal and the clock signal are transmitted via the lines 511, 512, 513, 514 of the two line pairs of the signal path 51 from the first integrated circuit 12 to the second integrated circuit 14. In this case, the first integrated circuit 12 functions as a transmitter, and the second integrated circuit functions as a receiver.

The second integrated circuit receives the first useful signal, the second useful signal and the clock signal. The first averaging device 371 receives the potentials of the first line 511 and of the second line 512 of the first line pair and generates a first average value signal, which represents the average value of the potentials of the first line 511 and of the second line 512 of the first line pair. The second averaging device 371 receives the potentials of the first line 513 and of the second line 514 of the second line pair and generates a second average value signal, which represents the average values of the potentials of the first line 513 and of the second line 514 of the second line pair. The average value signals are transmitted from the averaging devices 371, 372 to the inputs of the clock conditioning device 375. By amplifying and delaying the difference between the average value signals, the clock conditioning device 375 generates a second internal clock signal at its outputs, which represents a second internal clock.

The first differential amplifier 351 generates a differential signal from the difference between the potentials of the first line 511 and of the second line 512 of the first line pair, which differential signal is transmitted to the first sampling device 354 and to the second sampling device 355. The first sampling device 354 and the second sampling device 355 sample the first differential signal in a manner controlled by the second internal clock. The second differential amplifier 361 generates a differential signal from the difference between the potentials of the first line 513 and of the second line 514 of the second line pair, which differential signal is transmitted to the third sampling device 364 and to the fourth sampling device 365. The third sampling device 364 and the fourth sampling device 365 sample the second differential signal in a manner controlled by the second internal clock.

The second internal clock can be represented by an internal clock signal upon whose rising and falling edges a bit from the differential signals is respectively to be sampled. In this case, by way of example, the first sampling device 354 and the third sampling device 364 are designed to sample the first and second differential signal, respectively, upon each rising edge of the second internal clock signal, wherein the second sampling device 355 and the fourth sampling device 365 are designed to sample the first and the second differential signal, respectively, upon each falling edge of the second internal clock signal.

In addition to the above illustration with reference to FIG. 5, the two integrated circuits can be designed such that useful signals and/or a clock signal can furthermore be transmitted from the second integrated circuit 14 to the first integrated circuit 12 via the signal path 51 or via some other signal path.

Both the first integrated circuit 12 and the second integrated circuit 14 can in each case include for example a memory controller, a memory component, a processor or some other integrated circuit. By way of example, the first integrated circuit 12 is a memory controller and the second integrated circuit 14 is a memory component, or vice versa, or both integrated circuits 12, 14 are memory components. In this case, the information represented by the useful signals includes for example data, addresses or control commands.

Figure 6:
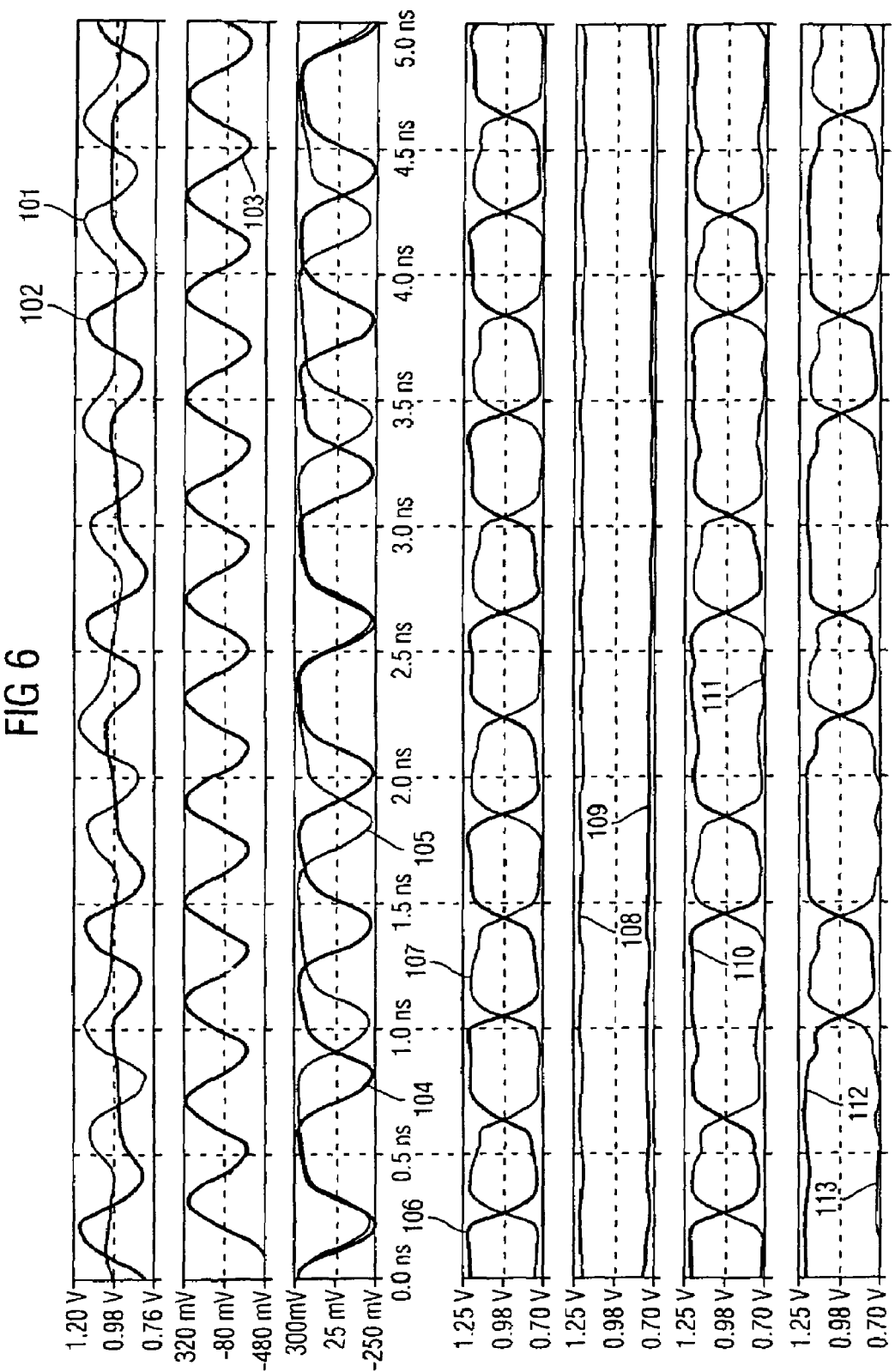
FIG. 6 illustrates a schematic illustration of signals in one integrated circuit.

FIG. 6 is a schematic illustration of signals in an integrated circuit 14 such as has been explained above with reference to FIG. 5. Time is assigned to the abscissa and voltages or potential differences are assigned to the ordinates. The times indicated by way of example on the abscissa correspond to a data rate of 5 Gb per line pair.

The potential 101 on the first line 511 of the first line pair and at the first input of the first differential amplifier 351 is illustrated in the first row of FIG. 6. Furthermore, the potential 102 of the second line 512 of the first line pair and of the second input of the second differential amplifier 351 is illustrated in the first row. It can be discerned that the average value of the potentials 101, 102 oscillates with essentially constant amplitude and frequency. The potentials of the first line 513 and of the second line 514 of the second line pair and of the inputs of the second differential amplifier 361 are not illustrated in FIG. 6. Furthermore, it can be discerned in FIG. 6 that the difference between the potentials 101, 102 represents the bit sequence 101101101 . . . . Its average value oscillates essentially with the same amplitude and the same frequency as the average value of the potentials 101, 102. The difference between the potentials (not illustrated in FIG. 6) of the second line pair represents the bit sequence 101110111011 . . . .

The second row of FIG. 6 illustrates a clock signal 103 such as is present at the output of the clock conditioning device 375 from FIG. 5. As explained above with reference to FIG. 5, the clock signal is obtained from the difference between the average value of the potentials of the first line pair and the average value of the potentials of the second line pair.

The first differential signal 104 generated from the difference between the potentials of the first line pair 511, 512 by the first differential amplifier 351 is illustrated in the third row of FIG. 6. Furthermore, the second differential signal 105 generated from the difference between the potentials of the second line pair 513, 514 by the second differential amplifier 361 is illustrated in the third row of FIG. 6. It can be discerned that the first differential signal represents the bit sequence 101101101 . . . if it is sampled upon each zero crossing of the second internal clock signal 103. Furthermore, it can be discerned that the second differential signal 105 represents the bit sequence 101110111011 . . . if it is sampled upon each zero crossing of the second internal clock signal 103.

The signal 106 generated by the third sampling device 364 by sampling the second differential signal 105 upon each rising edge of the second internal clock signal 103 is illustrated in the fourth row of FIG. 6. The signal 106, 107 represents the bit sequence 101010 . . . .

The signal 108, 109 generated by the fourth sampling device 365 by sampling the second differential signal 105 upon each falling edge of the second internal clock signal 103 is illustrated in the fifth row of FIG. 6, the signal representing the bit sequence 111111 . . . .

The signal 110, 111 generated by the first sampling device 354 by sampling the first differential signal 104 upon each rising zero crossing of the second internal clock signal 103 is illustrated in the sixth row of FIG. 6. The signal represents the bit sequence 110110110 . . . .

The signal 112, 113 generated by the second sampling device 355 by sampling the second differential signal 104 upon each falling zero crossing of the second internal clock signal 103 is illustrated in the seventh row of FIG. 6. The signal represents the bit sequence 011011011 . . . .

Figure 7:
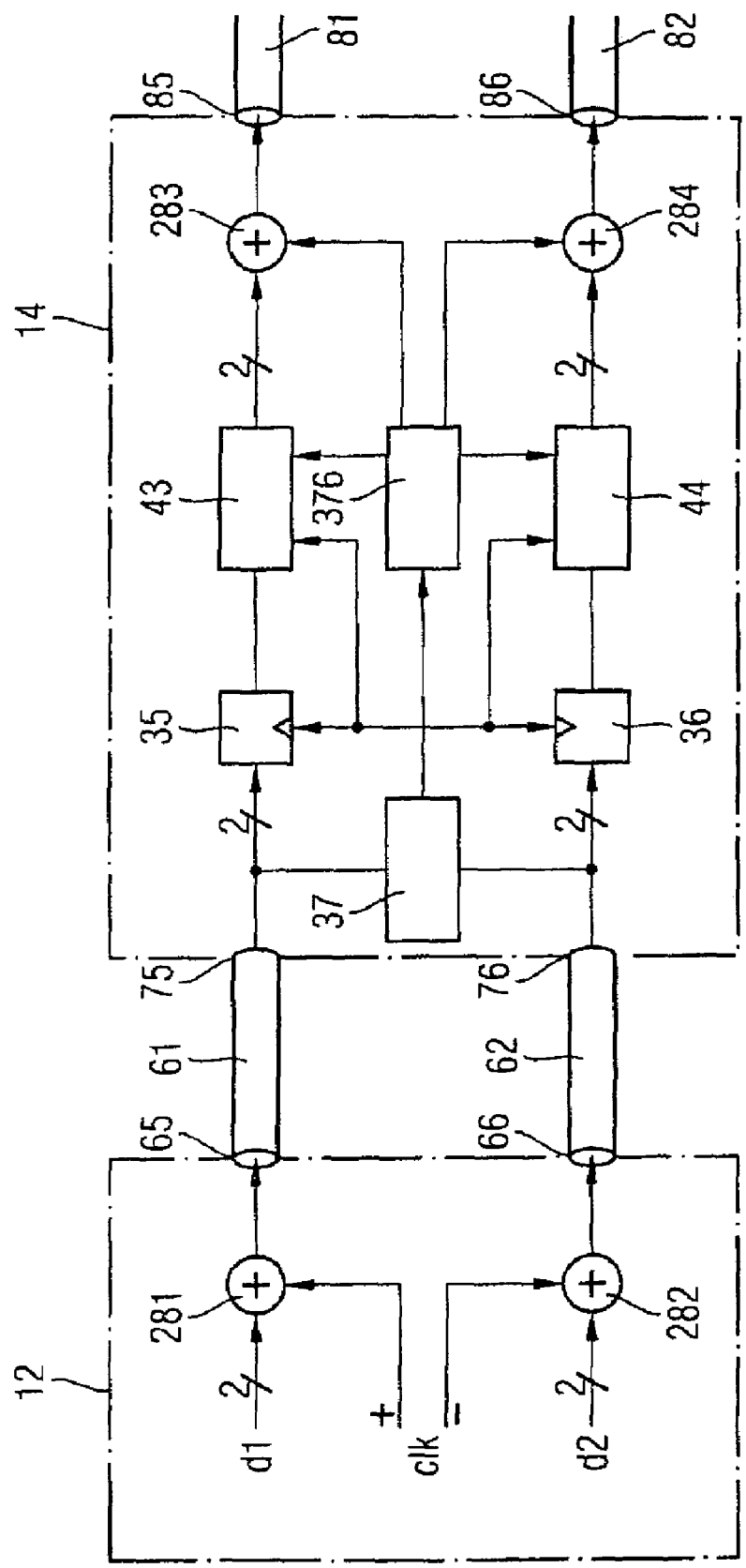
FIG. 7 illustrates a schematic illustration of two integrated circuits coupled to one another.

FIG. 7 is a schematic illustration of a first integrated circuit 12 and a second integrated circuit 13, which are connected to one another via a first line pair 61 and a second line pair 62. The second integrated circuit 14 is furthermore connected via a third line pair 81 and a fourth line pair 82 to a further receiver, which is not illustrated in FIG. 7.

The first integrated circuit 12 includes a first adder 281 and a second adder 282. The first adder 281 receives a first differential signal d1 from a circuit that is not illustrated in FIG. 7. The second adder 282 receives a second differential signal d2 from the circuit that is not illustrated or from a further circuit that is not illustrated. Furthermore, the adders 281, 282 receive a first internal clock signal clk, wherein the first adder 281 receives the noninverted signal and the second adder 282 receives the inverted signal. The first adder 281 outputs a first summation signal, which corresponds to the sum of the first differential signal d1 and the noninverted clock signal, to a first pair 65 of outputs of the first integrated circuit 12, the first pair being connected to the first line pair 61. The second adder 282 outputs a second summation signal, which corresponds to the sum of the second differential signal d2 and the inverted clock signal, to a second pair 66 of outputs of the first integrated circuit 12, the second pair being connected to the second line pair 62. The first summation signal thus contains a first useful signal, which corresponds to the first differential signal d1, in the form of a modulated difference between the electrical potentials of the first line pair 61. The second summation signal thus contains a second useful signal, which corresponds to the second differential signal d2, in the form of a modulated difference between the electrical potentials of the second line pair 62. Furthermore, both summation signals together contain a clock signal to the first internal clock signal. This clock signal is represented by the modulated difference between the common mode signals of the line pairs 61, 62 or by the difference between the average value of the potentials of the first line pair 61 and the average value of the second line pair 62.

The second integrated circuit 14 includes a first receiver circuit 35, which is connected to a first two-pole input 75 of the second integrated circuit 14, a second receiver circuit 36, which is connected to a second two-pole input 76 of the second integrated circuit 14, and a third receiver circuit 37, which is connected both to the first input 75 and to the second input 76. An output of the first receiver circuit 35 is connected to an input of a first FIFO memory 43. An output of the first FIFO memory 43 is connected to an input of a third adder 283. An output of the third adder 283 is connected to a first output of the integrated circuit 14. An output of the second receiver circuit 36 is connected to an input of a second FIFO memory 44. An output of the second FIFO memory 44 is connected to an input of a fourth adder 284. An output of the fourth adder 284 is connected to a second output 86 of the second integrated circuit 14.

An output of the third receiver circuit is connected to a clock input of the first receiver circuit 35, to a clock input of the second receiver circuit 36, to a first clock input of the first FIFO memory 43, to a first input of the second FIFO memory 44 and to an input of a clock conditioning device 376. A first output of the clock conditioning device 376 is connected to a second clock input of the first FIFO memory 43. A second output of the clock conditioning device 376 is connected to a second input of the third adder 283. A third output of the clock conditioning device 376 is connected to a second clock input of the second FIFO memory 44. A fourth output of the clock conditioning device 376 is connected to a second input of the fourth adder 284.

The third receiver circuit 37 generates a second internal clock signal from the difference between the average value of the potentials of the first line pair 61 and the average value of the potentials of the second line pair 62. The second internal clock signal is transmitted to the clock input of the first receiver circuit 35, to the clock input of the second receiver circuit 36, to the first clock input of the first FIFO memory 43, to the first clock input of the second FIFO memory 44 and to the input of the clock conditioning device 376. The clock conditioning device 376 generates from the second internal clock signal a stabilized third internal clock signal having for example a fixed phase difference or a constant delay with respect to the second internal clock signal. The phase difference between the third internal clock signal and the second internal clock signal can alternatively vary within a predetermined interval. This predetermined interval of the phase difference is predetermined inter alia by the depth of the FIFO memories 43, 44. For this purpose, the clock conditioning device 376 includes for example a PLL or a DLL.

The third internal clock signal is transmitted from the clock conditioning device 376 to the second clock input of the first FIFO memory 43, to the second clock input of the second FIFO memory 44, to the second input of the third adder 283 and to the second input of the fourth adder 284. In this case, the outputs of the clock conditioning device 376 can be embodied in the form of a single output or be connected in parallel with one another. As an alternative, the clock conditioning device 376 transmits different clock signals having different phase relationships or different delays with respect to the internal clock signal to the second clock input of the first FIFO memory 43, to the second clock input of the second FIFO memory 44, to the second input of the second adder 283 and to the second input of the fourth adder 284.

In a manner similar to that already described above with reference to FIG. 4, the third receiver circuit 37 of the second integrated circuit 14 can also perform clock multiplication. The resulting oversampling of the first useful signal received in the form of a modulated difference between the potentials of the first line pair 61 and of the second useful signal received in the form of a modulated difference between the potentials of the second line pair 62 can be used to adjust a phase of the second internal clock signal or a phase difference or delay— generated by the clock conditioning device 376—of the third internal clock signal with respect to the second internal clock signal.

The FIFO memories 43, 44 serve for reliably transferring the information represented in the signals from the region of the second internal clock signal to the region of the third internal clock signal. The signals output by the FIFO memories 43, 44 and the information represented by the signals output can furthermore be transmitted to further circuits that are not illustrated in FIG. 7, for example to memory circuits, circuits for a memory control or for a data processing.

The information items received from the first integrated circuit or else information items generated or conditioned by circuits that are not illustrated in FIG. 7 can be transmitted by using the third adder 283 and the fourth adder 284 via the outputs 85, 86 from the second integrated circuit 14 to a further integrated or non-integrated circuit. FIG. 7 primarily illustrates a transmission of the information items received from the first integrated circuit 12 from the FIFO memories 43, 44 via the adders 283, 284 to the outputs 85, 86. The transmission proceeds for example in exactly the same way as above for the transmission from the first integrated circuit 12 to the second integrated circuit 14.

With regard to the above-described transmission of information items from the first integrated circuit 12 to the second integrated circuit 14, the first integrated circuit 12 represents a transmitter and the second integrated circuit 14 represents a receiver. In addition to the above illustration, the integrated circuits 12, 14 can be designed to transmit information items in the opposite direction.

Figure 8:
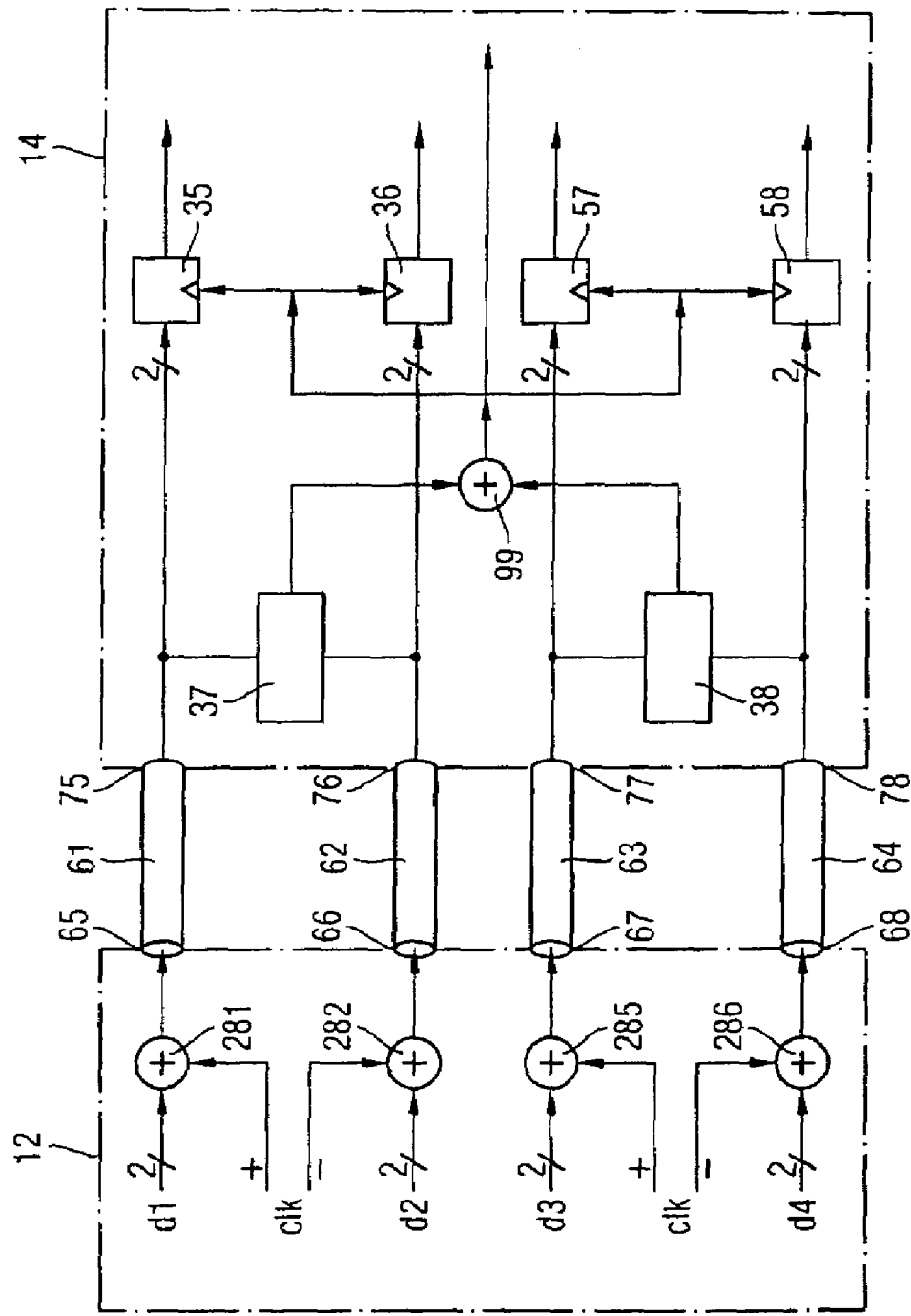
FIG. 8 illustrates a schematic illustration of two integrated circuits coupled to one another.

FIG. 8 is a schematic illustration of a first integrated circuit 12 and a second integrated circuit 14, which are connected to one another via at least four line pairs 61, 62, 63, 64. Via in each case two line pairs 61 and 62, and respectively 63 and 64, useful signals representing information items and a respective clock signal are transmitted for example in the manner explained above with reference to FIG. 7. For this purpose, in a manner similar to the first integrated circuit explained above with reference to FIG. 7, the first integrated circuit 12 has a first adder 281, which is connected to a first pair 65 of outputs, and a second adder 282, which is connected to a second output 66. The first and the second output are connected via a first line pair 61 and a second line pair 62 to a first pair 75 of inputs and respectively a second pair 76 of inputs of the second integrated circuit 14. In a manner similar to the second integrated circuit explained above with reference to FIG. 7, the second integrated circuit illustrated in FIG. 8 also has a first receiver circuit 35, a second receiver circuit 36 and a third receiver circuit 37.

In parallel with this first signal transmission path via the first line pair 61 and the second line pair 62, provision is made of a second, identically or similarly constructed signal transmission path via a third line pair 63 and a fourth line pair 64. For this purpose, the first integrated circuit 12 has a third adder 285, which is connected to a third pair 67 of outputs, and a fourth adder 286, which is connected to a fourth pair 68 of outputs. The third pair 67 of outputs and the fourth pair 68 of outputs of the first integrated circuit 12 are connected via the third line pair 63 and the fourth line pair 64, respectively, to a third pair 77 of inputs and respectively a fourth pair 78 of inputs of the second integrated circuit 14. The second integrated circuit 14 furthermore has a fourth receiver circuit 57, a fifth receiver circuit 58 and a sixth receiver circuit 38, which are connected up to the third pair 77 of inputs and the fourth pair 78 of inputs in a manner corresponding to the way in which the first receiver circuit 35, the second receiver circuit 36 and the third receiver circuit 37 are connected up to the first pair 75 of inputs and the second pair 76 of inputs. Further devices such as FIFO memories, a clock conditioning device, functional circuits (for example memory array, memory controller, processor) and outputs of the second integrated circuit 14 are not illustrated in FIG. 8 but can be provided in a manner similar to that in FIG. 7.

In contrast to the illustration in FIG. 7, an internal clock signal generated by the third receiver circuit 37 or the sixth receiver circuit 38 is not transmitted directly to clock inputs of the first receiver circuit 35 and of the second receiver circuit 36 and respectively of the fourth receiver circuit 57 and of the fifth receiver circuit 58. Instead, the outputs of the third receiver circuit 37 and of the sixth receiver circuit 38 are connected to inputs of a fifth adder 99. An output of the fifth adder 99 is connected to clock inputs of the first receiver circuit 35, of the second receiver circuit 36, of the fourth receiver circuit 57, of the fifth receiver circuit 58 and, if appropriate, a clock conditioning device and further devices that are not illustrated in FIG. 8. Auxiliary clock signals generated by the third receiver circuit 37 and the sixth receiver circuit 38 are firstly averaged by the fifth adder 99 before the averaged signal is transmitted to the clock inputs of the first receiver circuit 35, of the second receiver circuit 36, of the fourth receiver circuit 57, of the fifth receiver circuit 58 and, if appropriate, of further devices. The averaging by the fifth adder 99 can result in a reduction of the influence of noise, electromagnetic coupling-in (for example via the line pairs 61, 62, 63, 64) and other interference on the internal clock signals used for the sampling of the useful signals by the first, second, fourth and fifth receiver circuits 35, 36, 57, 58.

Figure 9:
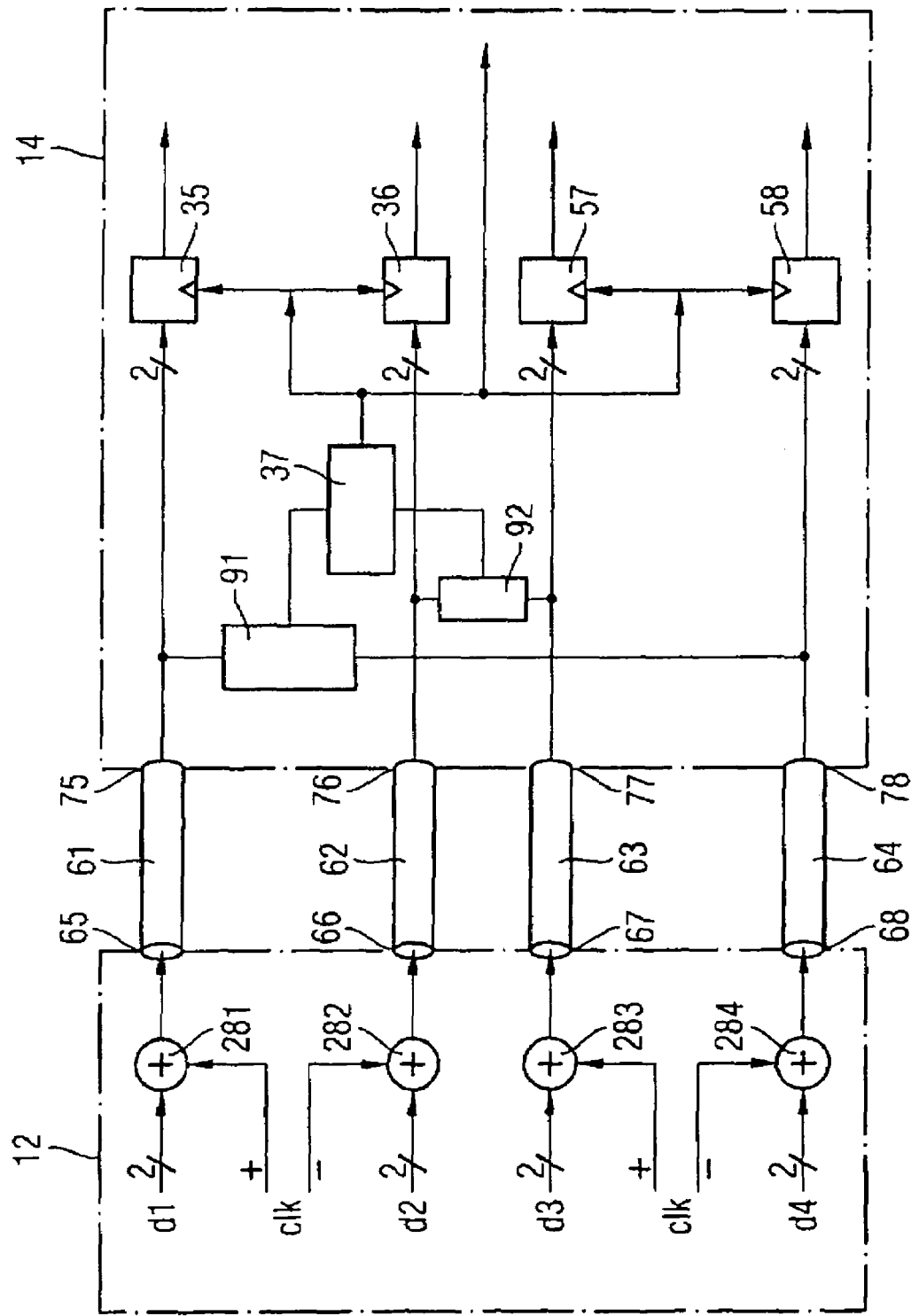
FIG. 9 illustrates a schematic illustration of two integrated circuits coupled to one another.

FIG. 9 is a schematic illustration of a first integrated circuit 12 and a second integrated circuit 14, which are constructed in a manner similar to the integrated circuits explained above with reference to FIG. 8 and are connected to one another via at least four line pairs 61, 62, 63, 64. In a manner similar to the integrated circuits explained above with reference to FIGS. 7 and 8, the integrated circuits 12, 14 illustrated in FIG. 9 are also designed to exchange a first useful signal in the form of a modulated difference between the electrical potentials of a first line pair 61, a second useful signal in the form of a modulated difference between the electrical potentials of a second line pair 62 and a first clock signal in the form of a modulated difference between the average value of the potentials of the first line pair 61 and the average value of the potentials of the second line pair 62. Furthermore, in a manner similar to the integrated circuits explained above with reference to FIG. 8, the integrated circuits 12, 14 illustrated in FIG. 9 are designed to exchange a third useful signal in the form of a modulated difference between the electrical potentials of a third line pair 63, a fourth useful signal in the form of a modulated difference between the electrical potentials of a fourth line pair 64 and a second clock signal in the form of a modulated difference between the average value of the potentials of the third line pair 63 and the average value of the potentials of the fourth line pair 64.

The average value of the potentials of the first line pair 61 and the average value of the potentials of the second line pair 64 are averaged by using a first averaging device 91, which is connected to a first input of a third receiver circuit 37. The average value of the potentials of the second line pair 62 and the average value of the potentials of the third line pair 63 are averaged by using a second averaging device 92, which is connected to a second input of the third receiver circuit 37. The averaging of the potentials of the first line pair 61 and of the fourth line pair 64 can be effected in one stage by averaging the four potentials or in two stages by averaging the average value of the first line pair and the average value of the second line pair. The same correspondingly holds true for the averaging of the potentials of the second line pair 62 and of the third line pair 63.

An output of the third receiver circuit 37 is connected to clock inputs of the first receiver circuit 35, of the second receiver circuit 36, of the fourth receiver circuit 57, of the fifth receiver circuit 58 and, if appropriate, to further devices that are not illustrated in FIG. 9.

Overall, the third receiver circuit 37 thus determines an internal clock signal used for the sampling of the useful signals by the first receiver circuit 35, the second receiver circuit 36, the fourth receiver circuit 57 and the fifth receiver circuit 58 from the difference between an average value of the potentials of the first line pair 61 and of the fourth line pair 64 and an average value of the potentials of the second line pair 62 and of the third line pair 63. This additional averaging can bring about a suppression of noise, electromagnetic coupling-in and other interference and the influence thereof on the sampling of the useful signals.

Figure 10:
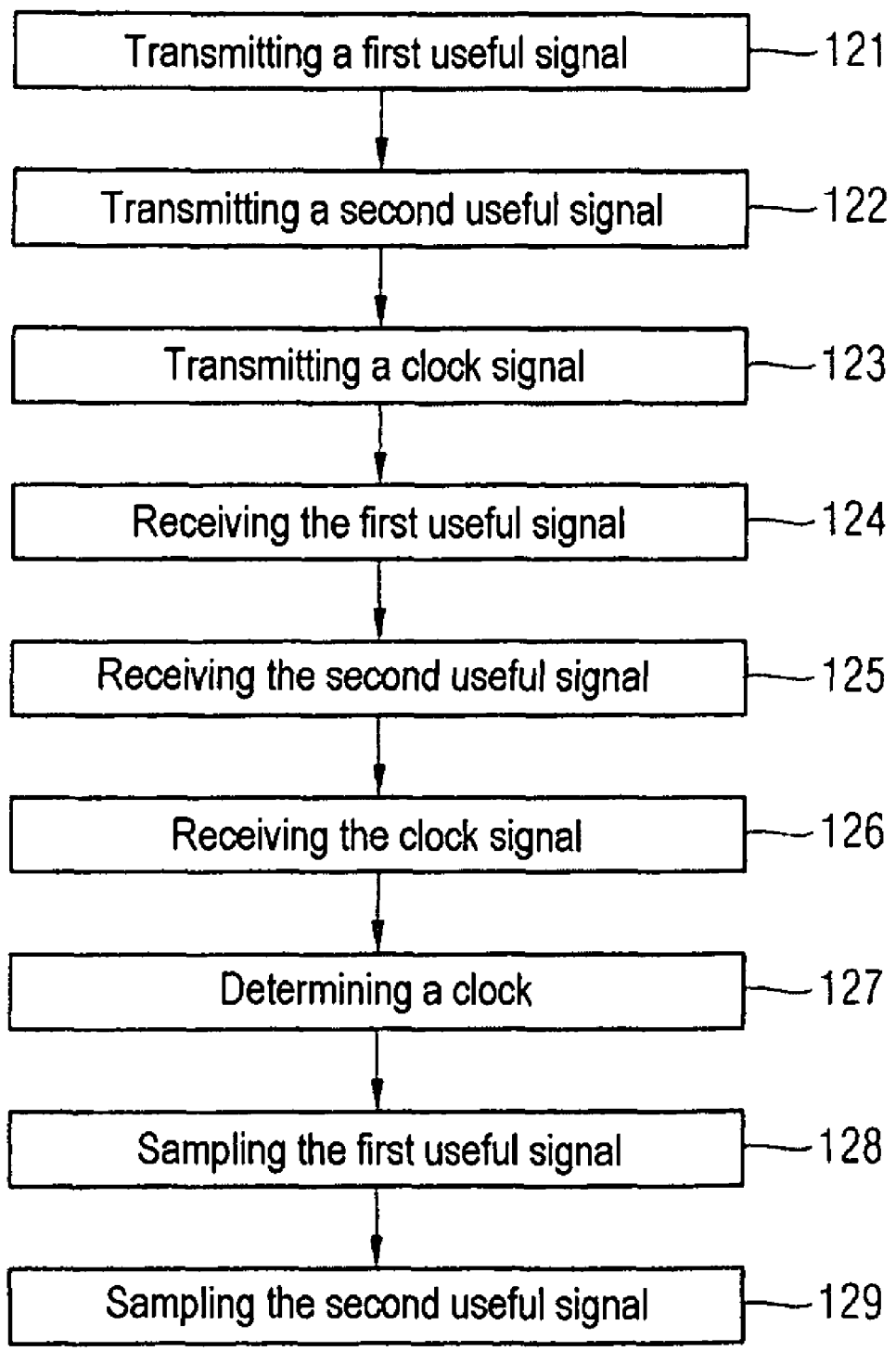
FIG. 10 illustrates a schematic flowchart of a method.

FIG. 10 is a schematic illustration of a flowchart of a method for transmitting and receiving useful signals and a clock signal. A first process 121 involves transmitting a first useful signal in the form of a modulated difference between the electrical potentials of a first line pair. A second process 122 involves transmitting a second useful signal in the form of a modulated difference between the electrical potentials of a second line pair. A third process 123 involves transmitting a clock signal in the form of a modulated difference between the average value of the potentials of the first line pair and the average value of the potentials of the second line pair.

The first process 121, the second process 122 and the third process 123 are performed for example simultaneously or essentially simultaneously. In this case, the first useful signal represents a first information item, and the second useful signal represents a second information item. The first process 121, the second process 122 and the third process 123 are performed for example by an integrated circuit such as has been described above with reference to FIG. 1, 2, 5, 7, 8 or 9.

A fourth process 124 involves receiving the first useful signal. A fifth process 125 involves receiving the second useful signal. A sixth process 126 involves receiving the clock signal. The fourth process 124, the fifth process 125 and the sixth process 126 are performed for example simultaneously or essentially simultaneously.

A seventh process 127 involves determining a clock from the clock signal. An eighth process 128 involves sampling the first useful signal in a manner controlled by the clock in order to obtain the first information item represented by the first useful signal. A ninth process 129 involves sampling the second useful signal in a manner controlled by the clock in order to obtain the second information item represented by the second useful signal. The fourth process 124, the fifth process 125, the sixth process 126, the seventh process 127, the eight process 128 and the ninth process 129 are performed for example in an integrated circuit such as have been described above with reference to FIGS. 1 to 9.

In general, when transmitting a first useful signal in the form of a modulated difference between the electrical potentials of a first line pair and a second useful signal in the form of a modulated difference between the electrical potentials of a second line pair an outgoing clock signal is transmitted in the form of a modulated difference between the average value of the potentials of the first line pair and the average value of the potentials of the second line pair. The average value of the potentials of a line pair is also referred to as a common mode signal; therefore, the clock signal is transmitted as a difference between two common mode signals.

It is thus possible to transmit via a total of just four lines two outgoing useful signals and an outgoing clock signal which can be used for sampling the outgoing useful signals. Without additional lines or pins or contacts, a dedicated outgoing clock signal can be transmitted for each group of two outgoing useful signals or four useful signal lines.

In the case of transmission of four outgoing useful signals via four line pairs, the quality of the recovered clock can be improved further by averaging. By way of example, firstly an average value of the potentials of a first and a third line pair and an average value of the potentials of a second and a fourth line pair are formed in one or two stages in each case. The clock is then obtained from the difference between the two average values. As an alternative, by way of example, firstly a first outgoing clock signal in the form of a modulated difference between the average value of the potentials of the first line pair and the average value of the potentials of the second line pair and a second outgoing clock signal in the form of a modulated difference between the average value of the potentials of the third line pair and the average value of the potentials of the fourth line pair are received. The clock is then determined from averaging of the first outgoing clock signal and the second outgoing clock signal.

The described transmission of outgoing useful signals and an outgoing clock signal requires only circuits of little complexity both at the transmitter and at the receiver. By way of example, the outgoing clock signal can be tapped off from the two line pairs at the receiver using just four capacitors. At the transmitter, only adders are required in order to apply the outgoing useful signals and the outgoing clock signal to two line pairs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for transmitting useful signals and a clock signal from a transmitter via a first line pair and a second line pair to a receiver comprising:

transmitting a first useful signal in the form of a modulated difference between the electrical potentials of the first line pair;

transmitting a second useful signal in the form of a modulated difference between the electrical potentials of the second line pair; and transmitting the clock signal in the form of a modulated difference between the average value of the potentials of the first line pair and the average value of the potentials of the second line pair.

2. The method of claim 1, wherein the first useful signal represents a first information item and the second useful signal represents a second information item, comprising:
generating the first useful signal in a manner controlled by a clock and the first information item;
generating the second useful signal in a manner controlled by the clock and the second information item; and
generating the clock signal in a manner controlled by the clock.

3. The method of claim 1, comprising wherein the transmitter is an integrated circuit.

4. The method of claim 1, comprising wherein the receiver is an integrated circuit.

5. The method of claim 1, comprising wherein the transmitter is any of a memory controller and a memory component.

6. The method of claim 1, comprising wherein the receiver is any of a memory controller and a memory component.

7. A method for receiving useful signals and a clock signal from a transmitter via a first line pair and a second line pair, comprising:
receiving a first useful signal in the form of a modulated difference between the electrical potentials of the first line pair;
receiving a second useful signal in the form of a modulated difference between the electrical potentials of the second line pair;
receiving the clock signal in the form of a modulated difference between the average value of the potentials of the first line pair and the average value of the potentials of the second line pair; and
determining a clock from the clock signal.

8. The method of claim 7, furthermore comprising:
sampling the first useful signal in a manner controlled by the clock in order to obtain first information represented by the first useful signal; and
sampling the second useful signal in a manner controlled by the clock in order to obtain second information represented by the second useful signal.

9. The method of claim 8, furthermore comprising:
receiving a third useful signal in the form of a modulated difference between the electrical potentials of a third line pair;
receiving a fourth useful signal in the form of a modulated difference between the electrical potentials of a fourth line pair; and
receiving a further clock signal in the form of a modulated difference between the average value of the potentials of the third line pair and the average value of the potentials of the fourth line pair,
wherein the clock is determined from the clock signal and the further clock signal.

10. The method of claim 9, comprising determining the clock from an average value of the clock signal and of the further clock signal.

11. The method of claim 7, furthermore comprising:
receiving a third useful signal in the form of a modulated difference between the electrical potentials of a third line pair; and
receiving a fourth useful signal in the form of a modulated difference between the electrical potentials of a fourth line pair,
wherein the clock is determined from the modulated difference between the average value of the potentials of the first line pair and of the fourth line pair and the average value of the potentials of the second line pair and of the third line pair.

12. The method of claim 7, comprising wherein the transmitter is any of a memory controller and a memory component.

13. A transmitter for transmitting information and clock via at least two line pairs to a receiver comprising:
a first output driver, which is connected to a first pair of outputs for the connection of a first line pair, for modulating the difference between the potentials of the first line pair, which represents a first information item;
a second output driver, which is connected to a second pair of outputs for the connection of a second line pair, for modulating the difference between the potentials of the second line pair, which represents a second information item; and
a clock driver, which is connected to the first pair of outputs and the second output driver, for modulating the difference between the average value of the potentials of the first line pair and the average value of the potentials of the second line pair, which represents the clock.

14. The transmitter of claim 13, comprising wherein the transmitter is any of a memory controller, a memory component and another integrated circuit.

15. The transmitter of claim 13, comprising wherein the transmitter is an integrated circuit.

16. A receiver for receiving information and a clock via at least two line pairs from a transmitter comprising:
a first receiver circuit, which is connected to a first pair of inputs for the connection of a first line pair, for detecting the modulated difference between the potentials of the first line pair, which represents a first information item;
a second receiver circuit, which is connected to a second pair of inputs for the connection of a second line pair, for detecting the modulated difference between the potentials of the second line pair, which represents a second information item; and
a third receiver circuit, which is connected to the first and the second pair of inputs, for detecting the modulated difference between the average value of the potentials of the first line pair and the average value of the potentials of the second line pair, which represents the clock.

17. The receiver of claim 16, comprising wherein a first input of the third receiver circuit is connected via a first capacitor to a first line of the first line pair and via a second capacitor to a second line of the first line pair, and wherein a second input of the third receiver circuit is connected via a third capacitor to a first line of the second line pair and via a fourth capacitor to a second line of the second line pair.

18. The receiver of claim 16, furthermore comprising:
a fourth receiver circuit, which is connected to a third pair of inputs for the connection of a third line pair, for detecting the modulated difference between the potentials of the third line pair, which represents a third information item; and
a fifth receiver circuit, which is connected to a fourth pair of inputs for the connection of a fourth line pair, for detecting the modulated difference between the potentials of the fourth line pair, which represents a fourth information item.

19. The receiver of claim 18, comprising wherein a third input of the third receiver circuit is connected via a fifth capacitor to a first line of the third line pair and via a sixth capacitor to a second line of the third line pair, and wherein a fourth input of the third receiver circuit is connected via a seventh capacitor to a first line of the fourth line pair and via an eighth capacitor to a second line of the fourth line pair.

20. The receiver of claim 19, wherein the third receiver circuit comprises:
- a first averaging device, which is connected to the first input and the fourth input of the third receiver circuit, for forming a first average value of signals present at the first and the fourth input of the third receiver circuit;
- a second averaging device, which is connected to the second input and the third input of the third receiver circuit, for forming a second average value of signals present at the second and the fourth input of the receiver circuit; and
- a clock determining device for receiving the first and the second average value and for generating a clock from the difference between the first and the second average value.

21. The receiver of claim 19, wherein the third receiver circuit comprises:
- a first auxiliary clock device which is connected to the first input and the second input of the third receiver circuit, for forming a first auxiliary clock signal from the difference between the signals present at the first and the second input of the third receiver circuit;
- a second auxiliary clock device which is connected to the third input and the fourth input of the third receiver circuit, for forming a second auxiliary clock signal from the difference between the signals present at the third and the fourth input of the third receiver circuit; and
- a clock determining device for receiving the first and the second auxiliary clock signal and for generating a clock from an averaging of the first auxiliary clock signal and the second auxiliary clock signal.

22. The receiver of claim 16, comprising wherein the receiver is any of a memory controller and a memory component.

23. The receiver of claim 16, comprising wherein the receiver is an integrated circuit.

24. A memory including a transmitter comprising:
- a first output driver, which is connected to a first pair of outputs for the connection of a first line pair, for modulating the difference between the potentials of the first line pair, which represents a first information item;
- a second output driver, which is connected to a second pair of outputs for the connection of a second line pair, for modulating the difference between the potentials of the second line pair, which represents a second information item; and
- a clock driver, which is connected to the first pair of outputs and the second output driver, for modulating the difference between the average value of the potentials of the first line pair and the average value of the potentials of the second line pair, which represents the clock; and
- a receiver, the receiver comprising:
- a first receiver circuit, which is connected to a first pair of inputs for the connection of the first line pair, for detecting the modulated difference between the potentials of the first line pair, which represents a first information item;
- a second receiver circuit, which is connected to a second pair of inputs for the connection of the second line pair, for detecting the modulated difference between the potentials of the second line pair, which represents a second information item; and
- a third receiver circuit, which is connected to the first and the second pair of inputs, for detecting the modulated difference between the average value of the potentials of the first line pair and the average value of the potentials of the second line pair, which represents the clock;
- wherein the receiver receives the information items and the clock via the at least two line pairs from the transmitter.

25. The memory of claim 24, comprising being part of a computer.

* * * * *